US008746398B2

(12) United States Patent
Neogi et al.

(10) Patent No.: US 8,746,398 B2
(45) Date of Patent: Jun. 10, 2014

(54) METHODS AND DEVICES FOR ELECTROMAGNETICALLY TUNING ACOUSTIC MEDIA

(75) Inventors: Arup Neogi, Denton, TX (US); Ezekiel Walker, Denton, TX (US)

(73) Assignee: University of North Texas, Denton, TX (US)

( * ) Notice: Subject to any disclaimer, the term of this patent is extended or adjusted under 35 U.S.C. 154(b) by 15 days.

(21) Appl. No.: 13/462,682

(22) Filed: May 2, 2012

(65) Prior Publication Data

US 2013/0112496 A1 May 9, 2013

Related U.S. Application Data

(60) Provisional application No. 61/481,520, filed on May 2, 2011.

(51) Int. Cl.
*G10K 11/00* (2006.01)
*H05K 5/00* (2006.01)
*H01F 7/06* (2006.01)
*G02F 1/35* (2006.01)
*G02F 2/02* (2006.01)

(52) U.S. Cl.
USPC ........... 181/175; 181/155; 29/609.1; 359/326

(58) Field of Classification Search
USPC .................................. 181/175, 155; 29/609.1
See application file for complete search history.

(56) References Cited

U.S. PATENT DOCUMENTS

| | | | | |
|---|---|---|---|---|
| 3,330,956 | A * | 7/1967 | Wade | 359/286 |
| 7,939,987 | B1 * | 5/2011 | Solal et al. | 310/313 R |
| 8,094,023 | B1 * | 1/2012 | El-Kady et al. | 340/572.1 |
| 2003/0086647 | A1 * | 5/2003 | Willner et al. | 385/37 |
| 2010/0177376 | A1 * | 7/2010 | Arnold et al. | 359/307 |
| 2012/0068383 | A1 * | 3/2012 | Sinha et al. | 264/437 |
| 2012/0149126 | A1 * | 6/2012 | Wilson et al. | 436/175 |
| 2012/0325747 | A1 * | 12/2012 | Rietman et al. | 210/651 |
| 2013/0112496 | A1 * | 5/2013 | Neogi et al. | 181/175 |

OTHER PUBLICATIONS

Cummer, S., D. Schurig, "One path to acoustic cloaking," New Journal of Physics 9 (2007).

Garner, B., T. Cai, S. Ghosh, Z. Hu, and A. Neogi, "Refractive index change due to volume-phase transition in polyacrylamide gel nanospheres for optoelectronics and bio-photonics," App. Phys. Exp. 2 (2009).

Goffaux, C., J. Vigneron, "Theoretical study of a tunable phononic band gap system," Physical Rev. B 64 (2001).

(Continued)

*Primary Examiner* — David Warren
*Assistant Examiner* — Christina Russell
(74) *Attorney, Agent, or Firm* — Jackson Walker, L.L.P.

(57) ABSTRACT

An acoustic material can be electromagnetically tuned to produce alterations in its acoustical properties without physical contact. The acoustic material should contain a periodic structure and a medium that has acousto-elastical properties that can be altered through the application of electromagnetic radiation. Changes in volumetric properties such as density result in changes to the velocity at which sound passes through the material. The acoustic material can be a phononic crystal that undergoes a change in its acoustic bandgap after being subjected to electromagnetic radiation. This electromagnetic tuning ability results in the ability to change the acoustic properties of various phononic devices without physical contact.

24 Claims, 15 Drawing Sheets

(56) References Cited

OTHER PUBLICATIONS

Hirotsu, S., I. Yamamoto, A. Matsuo, T. Okajima, H. Furukawa, T. Yamamoto, "Brillouin scattering study of the volume phase transition in poly-N-Isopropylacrylamide gels," Journal of the Physical Society of Japan 64 (1995).
Khelif, A., P. Deymier, B. Djafari-Rouhani, J. Vasseur, L. Dobrzynski, "Two-dimensional phononic crystal with tunable narrow pass band: Application to a waveguide with selective frequency," J. of App. Phys. 94 (2003).
Kushwaha, M., P. Halevi, L. Borzynski, B. Djafari-Rouhani, "Acoustic Band Structure of Periodic Elastic Composites," Physical Rev. Letters 71 (1993).
Robillard, J., O. Bou Matar, J. Vasseur, P. Deymier, M. Stippinger, A. Hladky-Hennion, Y. Pennec, B. Djafari-Rouhani, "Tunable magnetoelestic phononic crystals," App. Phys. Letters 95 (2009).
Tang, H., S. Lee, "Direct experimental verification of the sound-induced tunable resonance on a flexible electrorheological layer," Journal of App. Phys. 101 (2007).
Torrent, D., J. Sanchez-Dehesa, "Acoustic cloaking in two dimension: a feasible approach," New Journal of Physics 10 (2008).
Wang, J., X. Xu, X. Liu, G. Xu, "A tunable acoustic filter made by periodical structured materials," App. Phys. Letters 94 (2009).
Wu, L., M. Wu, L. Chien, "The narrow pass band filter of tunable 1D phononic crystals with a dielectric elastomer layer," Smart Materials and Structures 18 (2009).

* cited by examiner

Figure 10
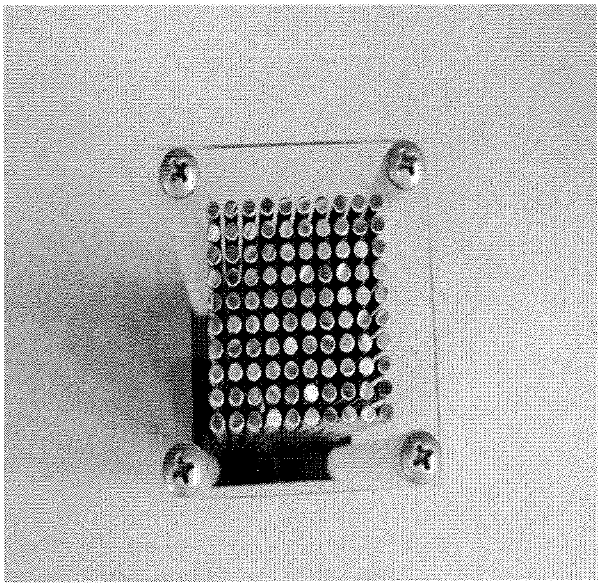
Figure 10a
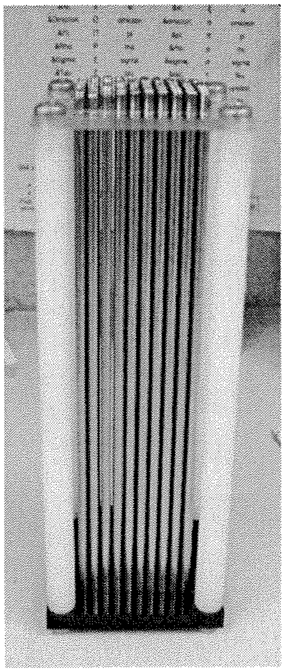
Figure 10b a b c a b c

METHODS AND DEVICES FOR ELECTROMAGNETICALLY TUNING ACOUSTIC MEDIA

This application claims priority to U.S. Provisional Patent Application Ser. No. 61/481,520, entitled "METHODS AND DEVICES FOR ELECTROMAGNETICALLY TUNING ACOUSTIC MEDIA," filed on May 2, 2011, the entire content of which is hereby incorporated by reference.

BACKGROUND

This invention pertains to methods and devices for controlling the propagation of sound and particularly to electromagnetically tunable acoustic devices.

Propagation of sound waves through various media has been studied for centuries. Propagation of sound waves through periodic media dates back to the late 1800's and the word of Gerhard Floquet. The groundwork for understanding wave propagation in three-dimensional periodic media as it is currently understood was established by Felix Bloch in 1928. The Bloch-Floquet theorem describes how a wave can travel through a periodic medium without scattering. Using the Bloch-Floquet theorem, developments in electronics, which deal primarily with the flow of electrons through a structure, and photonics, which deals the propagation of photons through a periodic structure, were made. Especially important was the development of theories to create electronic and photonic bandgaps. The theoretical and experiment development of photonic bandgaps lead directly to the development of a theory for phononic bandgap structure.

A phonon is a quantized vibration of a material analogous to the photon being a quantized oscillation of an electromagnetic field. Sound is a vibration of air and can thus be described in phononic terms. For example, sound is an audible vibration of air, and can thus be quantified as phonons. Earthquakes are non-audible vibrations of Earth's crust, and can similarly be quantified as phonons. The vibrations felt while driving a car are vibrations of the material structure of the car and can thus be characterized and described by phonons. Any vibration of a medium, whether audible, mechanical, or otherwise can be described by a phonon. Acoustics is the generalized term used for the behavior of any type of phonon. Thus the acoustic behavior of a tuning fork would characterize the sound emitted by the tuning fork, and how it vibrates and responds to vibrations. The acoustic behavior of a bridge would characterize the response of the bridge to vibrations including what types of vibrations could cause the bridge to collapse. The dynamics of the propagation of phonons through structures can be determined by applying the appropriate version of the wave equation. A bandgap is a range of phonon frequencies where no phonons can be transmitted through a material. A material exhibiting phononic bandgap behavior is also referred to as a phononic crystal.

Whereas photonic waves possess only a transverse component, phononic waves can have both longitudinal and transverse components. Using similar techniques to those used for photonic crystal, a structure exhibiting an acoustic bandgap could be made.

Tunable phononic crystals were first theoretically presented in 2003 (Khelif et al. 2003). The first tunable phononic crystal was tuned by physically changing the size of scatterers in the lattice. Tuning of a bandgap by changing the physical dimensions of the structure is difficult in practice. Physical tuning can result in unwanted defects in the lattice that would modify the bandgap or path of sound in the phononic crystal. In recent years, other methods for tuning phononic crystals have been introduced including electric (Tang and Lee 2007) or magnetic fields (Robillard et al. 2009), rotation of the crystal (Goffaux and Vigneron 2001), or by physically combining or taking apart two periodic structures (Wang et al. 2009).

Ideally, a method for tuning photonic crystal should be developed which does not require physical contact.

SUMMARY

The present invention relates generally to "acousto-optics." or more particularly to a material having acoustic properties that can be influenced by electromagnetic waves in the radio-frequency or microwave range.

Because light and sound waves travel through a medium at very different frequencies and are not influenced by one another, the design of a mechanical or optoelectronic device in which the propagation of sound can be controlled by light is a significant achievement. The current methods and devices relate to materials having acoustical properties. The properties of these materials can be influenced by electromagnetic waves. In particular, the electromagnetic waves can be used to change the phase of a polymer included in the material. The phase change induces a change in the density of the polymeric medium, thereby changing both the refractive index and the elasticity of the medium. Thus, the sound velocity travelling through the medium in the hypersonic range can be modified through modulation of its internal structure by the electromagnetic waves.

More particularly, the present methods and devices relate to an electromagnetically tunable acoustical bandgap material or, as it is more commonly known, phononic crystal. FIG. 1 shows an image of an example of silicon phononic crystal. Two components are required of this acoustic material: an artificial solid periodic structure, and a medium with acousto-elastical properties (i.e., bulk modulus, shear modulus, density, etc.) that are electromagnetically responsive.

A phononic crystal ("PnC") consists of a periodic arrangement of materials with a contrast in elastic properties. A phononic crystal is a structure that interacts with acoustic waves, and is composed of two or more periodically arranged elastically free vibrating materials with differing elastic characteristics. In general, the arrangement is such that, for a PnC composed of two materials, one material is made into specific shapes (such as cylinders, spheres, slabs, etc.), then periodically arranged in another material. The material that is shaped and arranged is called a scatterer, while the other material is called the background. Systems of three or more materials usually contain multiple scatterers with a single background, and a phononic crystal's behavior will differ based on the ambient medium (imagine the same phononic crystal operating in air, water, dirt, etc.). There are one-dimensional phononic crystals which primarily consist of layers of contrasting materials. The bandgaps for 1D phononic crystals are restricted to one direction. Similarly, there are 2D and 3D crystals with bandgaps in 2 or all directions. 2D and 3D structures consist of a lattice structure with contrasting scatterers. In all cases, the present acoustic bandgap material can be made by replacing one or more of the layers, the lattice structure, or the scatterers with a material that has acousto-elastical properties that can manipulated by an electromagnetic source. Though the crystal is made of small components, for sufficiently large wavelength phonons, the phononic crystal behaves as a single structure.

The acoustic dynamics, or behavior of sound as it passes through the phononic crystal, are determined by the size, shape, periodic arrangement, and orientation arrangement of the scatterers, the density, longitudinal, and transverse sound velocities of the materials used in the structure, and the wavevector of the impinging acoustic wave. The periodic arrangement details the spacing of scatterers. The orientation arrangement details the relationship between the orientation of a scatterer and its neighbors with respect to the impinging acoustic wave. Changing any combination of the acoustic dynamics variables will change the propagation behavior of the PnC on which an acoustic device is based. Changing dynamics variables in an acoustic device without physically replacing the component PnC equates to tuning the device.

The first component of the acoustic bandgap material is the periodic structure. The artificial solid periodic structure is preferably composed of two or more elastic materials. By careful consideration of the periodicity of the lattice, the shape of the scatterers in the lattice, and the contrasts in elasticity properties between the scatterers and the lattice structure, the material can be made to forbid the propagation of a select range or ranges of acoustic waves (Kushwaha et al. 1993). The variables involved in determining the acoustic dynamics include the size, shape, and arrangement of the scatterers, the density, longitudinal, and transverse sound velocities of the materials used in the structure, and the wavevector of the particular phonon.

The second component of the material is the use of a medium that has acousto-elastical properties that can be manipulated through the use of an electromagnetic source. Although there are currently proposed or fabricated photonic crystals that can be tuned through the use of electric fields, magnetic fields, rotation, or physical combination or separation of two periodic structures, the use of electromagnetic tuning has multiple advantages. In particular, no physical contact with the crystal is required. In addition, the electromagnetic source is readily engineered to a small scale. Because no physical contact is required, areas of the phononic crystal can be selectively tuned. Also, some materials are highly responsive to very narrow bandwidths of electromagnetic radiation. This can be used to minimize the power required to tune the crystal. Finally, the speed of response is comparable or superior to other techniques. N-Isopropylacrylamide ("NIPA") and Poly (N-Isopropylacrylamide) ("PNIPA") hydrogels can be used as the electromagnetically responsive medium because they are both polymers that undergo a rapid, nonlinear volumetric phase transition at a critical temperature.

Homogeneous periodic PnCs are uniformly periodic through the structure, and will affect a particular wavelength phonon uniformly throughout the structure. An inhomogeneous periodic PnC will have non-uniform, non-random variations in some combination of the factors included in determining the acoustic dynamics. A phonon's behavior, specifically its wavevector, will change as it passes through this type of structure. The particulars of the math involved are not the focus of this document, so they will not be discussed. Acoustic devices are essentially functionalized phononic crystals.

Since acoustic devices are functionalized PnCs, the effectiveness of the device is limited by the effectiveness of the PnC. A PnC will only affect an acoustic wave in the direction of periodicity. This introduces a dimensionality element. A PnC with one direction of periodicity (e.g.-repeating slab-layers) will only be effective in that direction. Since there is only one direction of effectiveness, the PnC is designated as 1-D. 2-D PnCs have a plane of effectiveness, and 3-D affects acoustics in all directions. The actual acoustic effect may not be the same in all directions. However, the dimensionality still is an indicator of whether a PnC is effective in one direction, a plane, or all directions. This dimensionality is grandfathered into the acoustic device.

The acoustic dynamics are determined by the size, shape, periodic arrangement, and orientation arrangement of the scatterers, the density, longitudinal, and transverse sound velocities of the materials used in the structure, and the wavevector of the impinging acoustic wave. The periodic arrangement details the spacing of scatterers. The orientation arrangement details the relationship between the orientation of a scatterer and its neighbors with respect to the impinging acoustic wave. Changing any combination of the acoustic dynamics variables will change the propagation behavior of the PnC on which an acoustic dev ice is based. Changing dynamics variables in an acoustic device without physically replacing the component PnC equates to a tuning the device.

An electromagnetically (EM) tunable acoustic device (EMTAD) is essentially a functionalized application of an EM tunable phononic cry stal (EMTPnC). EM tuning is accomplished by using some form of electromagnetic radiation from high-energy light (X-ray, UV) to lower-energy light (infrared, radio) to initiate a change in acoustic dynamics of the device by directly or indirectly, changing any, or some combination of the acoustic dynamic variables of the scatterers or background. The specific wavelength to be used is determined by the materials used in the structure. For example, a device could be based off a PnC composed of cylindrical ice rods in an oil medium. When the rods are in ice form, the device is designed to be a sonar shield by forbidding sonar frequencies from passing through. Using microwave EM radiation, the ice rods could be melted, changing the shape, arrangement, sound velocity, and periodicity of the underlying PnC. Because of the change in the above variables, the acoustic dynamics of the underlying PnC would change and allow sonar to pass through.

In the present disclosure, electromagnetic radiation is used to change the dynamic behavior of a phononic crystal and thus tune a device. As mentioned above, the periodic structure is composed of two or more elastic materials. Similar to electronic structures, based on the periodicity of the lattice, the size and shape of the scatterers, the orientation of the lattice, and the acousto-elastic contrast between the scatterers and background, the propagation of vibrations or acoustic waves can be controlled. In certain arrangements, the propagation of ranges of phonons can be blocked all together (illustrated in FIG. 2) (Kushwaha et al. 1993). This forbidden bandwidth is called the acoustic or phononic bandgap analogous to an electronic bandgap.

Overall, the acoustic material should have at least one phononic bandgap, either the scatterers or the lattice structure should have a bulk modulus that is responsive to electromagnetic radiation, and preferably the responsive change in the bulk modulus should be reversible. The acoustic material can be used to create electromagnetically tunable acoustic devices that can preferably be modified electromagnetically on the order of seconds or less, and do not require the removal or replacement of component parts to for tuning. Electromagnetically ("EM") tuning the acoustic device requires that either: (a) the lattice structure of the phononic crystal(s) changes with EM stimulation, (b) the acousto-elastic properties of the phononic crystal(s) are EM modulated, or (c) the orientation of the phononic crystal(s) is EM responsive. The specifics of the electromagnetic source are heavily dependent on the device and the materials used in the device.

The acoustic material is useful for designing an array of phononic devices such as tunable phonic crystal-based filters, cloaks in the acoustical domain for use in underwater acoustical devices and sensors, as well as sounds absorbers and filter for various auditoriums and highway, railway, or airway systems. The acoustic material can also be adapted to design high resolution ultrasonic and hypersonic medical imaging systems for improving the resolution of features that can be currently detected. The use of electromagnetically responsive materials to tune the phononic devices is highly advantageous in these applications.

The advantages of the present electromagnetically tunable phononic crystals include (a) No physical contact with the crystal is required, (b) The electromagnetic source is readily engineered to the large or small scale, (c) Because no physical contact is required, areas of the phononic cry stal can be selectively tuned, (d) Some materials are highly responsive to very narrow bandwidths of electromagnetic radiation, which can be used to minimize the power required to tune the crystal, and (e) Speed of response is comparable to electric and magnetic tuning, and superior to other mechanical techniques (material dependent).

BRIEF DESCRIPTION OF THE DRAWINGS

FIG. 10 shows: a) a top-down view of the device without hydrogel; and b) side view of the device without hydrogel.

DETAILED DESCRIPTION OF PREFERRED EMBODIMENTS

Generally, methods and devices for electromagnetically tuning acoustic material are described herein. In particular, acoustic material devices having a phononic bandgap are described. The acoustic devices contain components, such as scatterers or lattice structure, that have a bulk modulus that is responsive to electromagnetic radiation. The acousto-elastical properties of the material are altered as a result of the electromagnetic radiation, leading to changes in the acoustical or phononic bandgap. As a result, the acoustic material can be tuned to particular phononic bandgaps without physically contacting the material.

The acoustic material, having the structure of a phononic crystal, typically has two components. The first component is the periodic structure. The periodic structure can be made up of the lattice structure and scatterers. The second component is the medium that has acousto-elastical properties and can be manipulated through the use of an electromagnetic source. In some cases, the medium having the acousto-elastical properties is the periodic structure itself.

The periodic structure of the acoustic material may contain two or more elastic materials. Through carefully designed changes to the periodicity of the lattice, the shape of the scatterers in the lattice, and the elasticity properties contrasts between the scatterers and the lattice structure, the acoustic material can be made to forbid the propagation of select ranges of acoustic waves. The forbidden bandwidth is called the acoustical or phononic bandgap. To tune the phononic bandgap, the acoustic material takes advantage of materials that exhibit a volumetric change in their acousto-elastical properties. Most elastical properties are due to the bulk and shear moduli, and density of the materials in question. More specifically, a change in either the density or the bulk modulus of any of the materials will affect the velocity of sound through that material, essentially changing the elastical contrast of the structure and thus the phononic bandgap.

The present electromanetically tunable acoustic material requires the use of at least one material with physical properties that are EM responsive, and is intended to include all materials that would satisfy this criterion. Preferred examples of EM responsive materials that can be used in the present acoustic material include N-Isopropylacrylamide ("NIPA") and Poly (N-Isopropylacrylamide) ("PNIPA") hydrogels.

Figure 1:
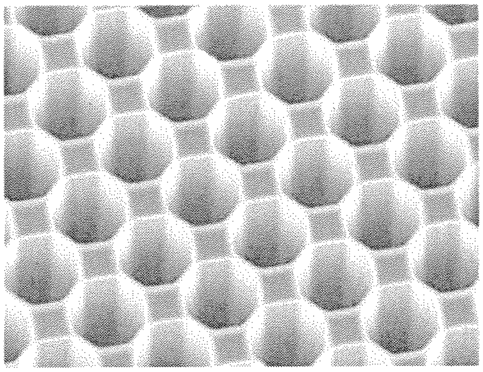
FIG. 1 shows an image of a silicon phononic crystal.
Figure 2:
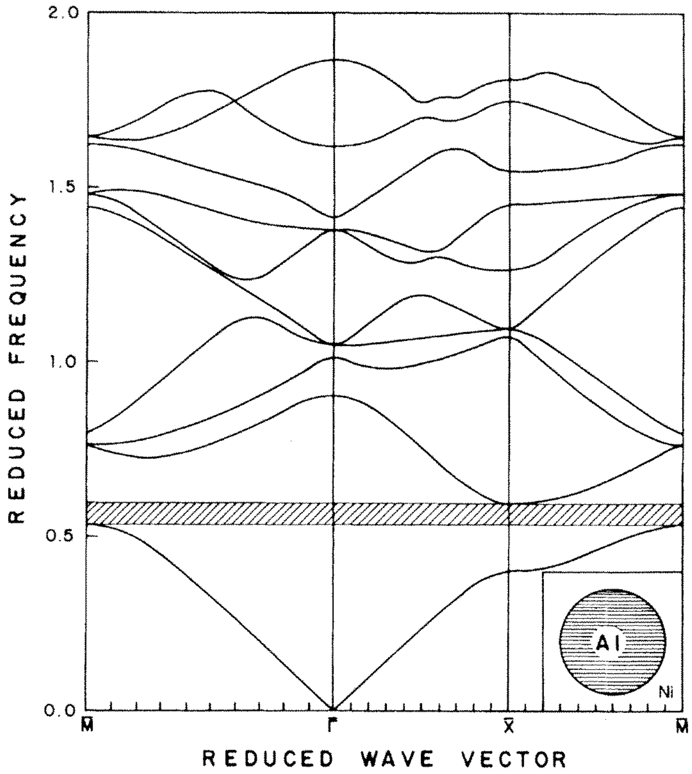
FIG. 2 shows the acoustic bandstructure of aluminum alloy cylinders in a nickel alloy background.
Figure 3:
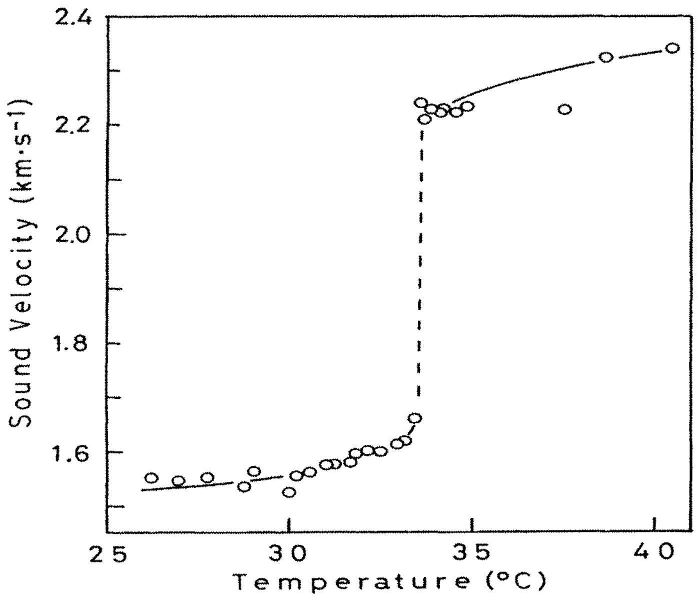
FIG. 3 shows the measured change in hypersonic sound velocity in PNIPA gel as temperature increases and it goes from a hydrophilic to hydrophobic state.

N-Isopropylacrylamide ("NIPA") and Poly (N-Isopropylacrylamide) ("PNIPA") hydrogels are polymers that undergo a rapid, nonlinear volumetric phase transition at a critical temperature. Below the critical temperature the polymer networks of the gel are hydrated (usually with water). Above the critical temperature, the gel becomes hydrophobic, and the water is expelled from the network resulting in change in the bulk modulus (a physical property) and in the density (a physical property) of the gel. The change in density is dependent on the ratio of polymer to water in the initial formation of the hydrogel. In addition, prior studies have shown about a 30% change in the velocity of sound through the medium which is related to the change in the bulk modulus and density. FIG. 3 shows the changes in hypersonic sound velocity in PNIPA gel as temperature increases and it undergoes a transformation between a hydrophilic and hydrophobic state. Thus, due to their ability to be manipulated by electromagnetic forces with a resultant effect on acoustical properties, NIPA and PNIPA are ideal polymers for inclusion in the acoustic material.

Since the acoustic dynamics of the phononic crystal or device are dependent on the density contrast of the scatterers to the background, changing the density of one material in the structure changes the acoustic dynamics. Again, changing the acoustic dynamics in a controlled manner is the same as tuning the structure. PNIPA hydrogels have been shown to respond to many different EM frequencies. For example, a 1533 nm infrared laser can be used to induce phase changes in the gel. Since the gels posses a variable density property as discussed in the previous paragraph, they are ideal for EM tunable acoustic device applications. Utilizing this special material property in conjunction with other materials that are highly responsive to radio frequency EM light bolsters the response of an acoustic device.

Figure 4:
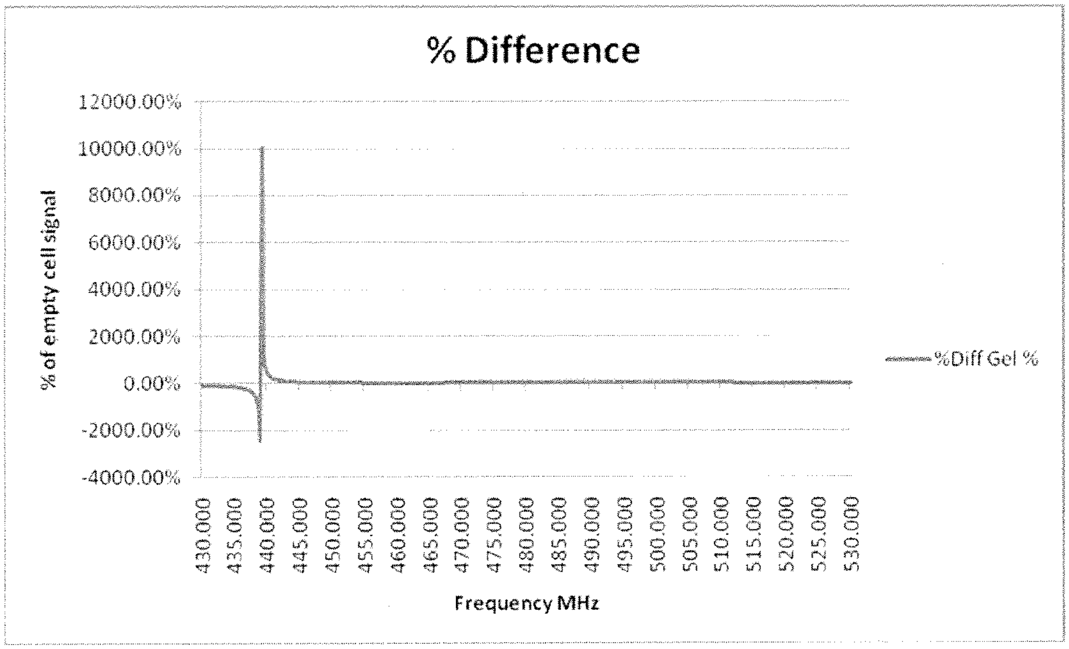
FIG. 4 shows the measured difference in RF electromagnetic response of PNIPA gels.

The sudden change in density of NIPA and PNIPA as a result of temperature change makes them ideal for applications in a tunable phononic filter. Data for the RF responsiveness of the PNIPA gels, shown in FIG. 4, is obtained by measuring the RF feedback of a cuvette cell filled with gel, and comparing it with that of the empty cell. At frequencies below/above 440 MHz, the gel filled cell behaves as an insulator as compared with the empty cell. At 440 MHz, the gel becomes highly responsive and the feedback becomes up to 100× greater than that of the empty cell. This data indicates that the gel, even without RF responsive particles, is responsive to RF electromagnetic frequencies. Additional preliminary data has indicated that the gels would undergo heating due to RF because of their highwater content and ability to add electromagnetically responsive materials to the polymer network. In some examples of the acoustical material. PNIPA gels are used as the electromagnetically responsive variable density or bulk modulus material.

Figure 5:
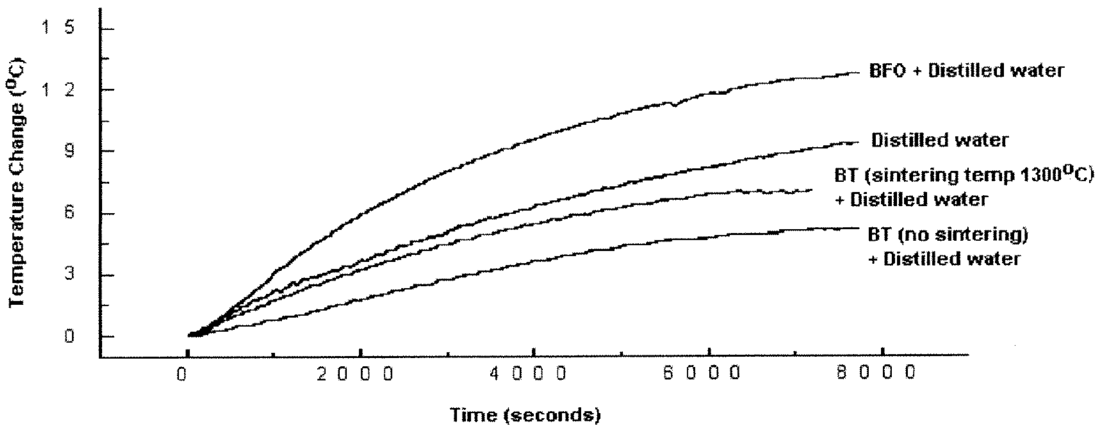
FIG. 5 shows the results of electromagnetically induced heating of distilled water containing various electromagnetically responsive materials.

Additional electromagnetically responsive materials that can be added to the polymer network include ferroelectric, dielectric, multiferroic, and similar materials that hove been shown to have a high response to an electromagnetic field. In particular, these materials include barium titanate ($BaTiO_3$ or "BT") and bismuth ferrite ($BiFeO_3$ or "BFO"). FIG. 5 shows the RF heating characteristics of distilled water with dispersed RF responsive Bismuth Ferrite (BFO) and Barium Titanite (BT). The results were obtained by placing each of the material systems in an insulating cell and measuring the temperature of the samples over time as a RF signal was passed through the samples. PNIPA has properties very similar to that of water, and should exhibit a very similar response. These materials, having various heating characteristics, can be used with the polymer gels to help change the state of the gels as a result of the electromagnetic induced heating.

It should be noted that NIPA and PNIPA gels are not required. Any material that exhibits a response to an electromagnetic source that causes it to undergo a volumetric change in density or bulk modulus would also suffice. In some examples, PNIPA gels are used as the scatterers of the phononic crystal. However, a variation would be to use the PNIPA gels as the lattice structure itself and use air or some other substance as the scatterer. Both examples would work, although using the gels as the scatterer material is one option.

Figure 6:
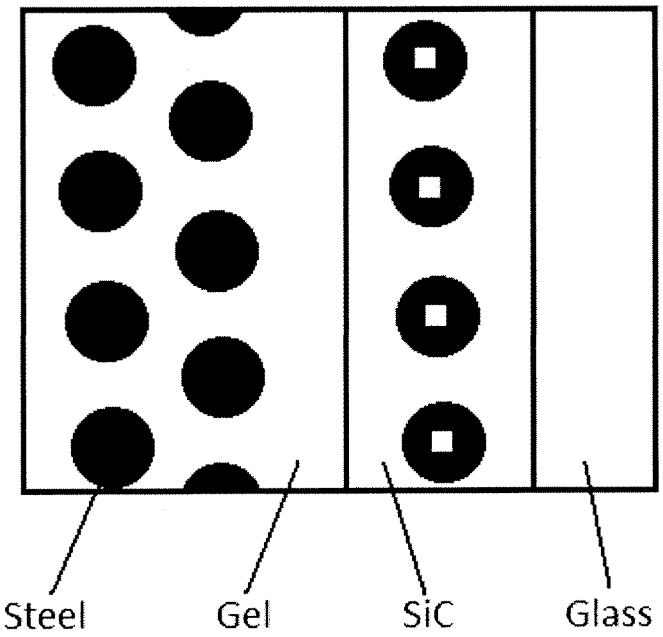
FIG. 6 shows the basic structure of an example of a phononic crystal with unable material.

FIG. 6 shows a schematic representation of an example of a phononic crystal heterostructure that was prepared. The structure is 2D periodic in the x-y plane with unit slices stacked together to form the complete crystal. Each unit slice consists of three layers. In terms of $a_0$, the lattice constant of the crystal, the first layer is comprised of two columns of steel spheres of radius $0.25a_0$ arranged hexagonally in a background of the PNIPAm gel. The second layer is a single layer of hollow steel spheres embedded in Silicon Carbide (SiC). The final layer of the unit slice is a homogeneous medium of glass. The thickness of each layer is (roughly) $1.6a_0$, $a_0$, and $0.45a_0$.

For the phononic crystal heterostructure represented in FIG. 6, the transmission/reflection characteristics were calculated. The calculation was done for a structure consisting of 8 unit slices for the state of the gel below/above the critical phase change temperature. Below the critical phase change temperature, the hydrophilic gel has a density that can be controlled by the PNIPAm concentration, but is roughly equal to that of water (1.320 $cm^3$ for our simulation). Raising the temperature caused the gel to undergo a discontinuous volumetric phase transition at rough 34° C., where the density of the gel increased to roughly twice that of water (1.929 $g/cm^3$ for this example). The sound velocity also changed from roughly 1.45 km/s to 2.25 km/s as can be seen in FIG. 3. Comparison of the gel itself below and above the critical phase change temperature revealed differing area measurements giving an indication of the volumetric change. At 21.7° C., the PNIPA had an area of 18.11 $mm^2$. while at 46.6° C., the area decreased to 10.62 $mm^2$.

Figure 7:
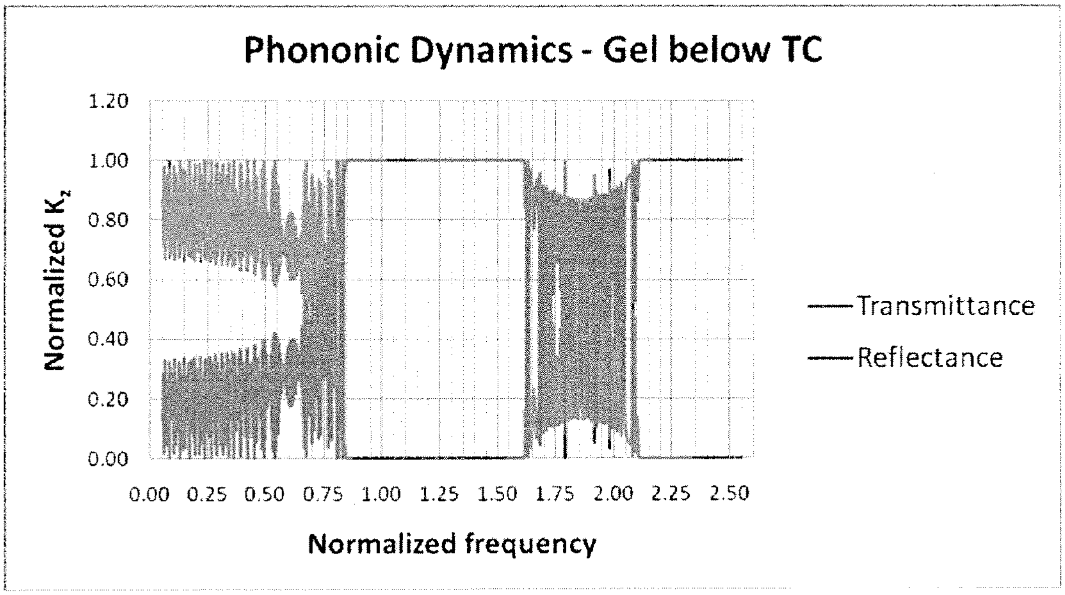
FIG. 7 shows the transmittance and reflectance characteristics of an example structure with the gel below critical temperature.
Figure 8:
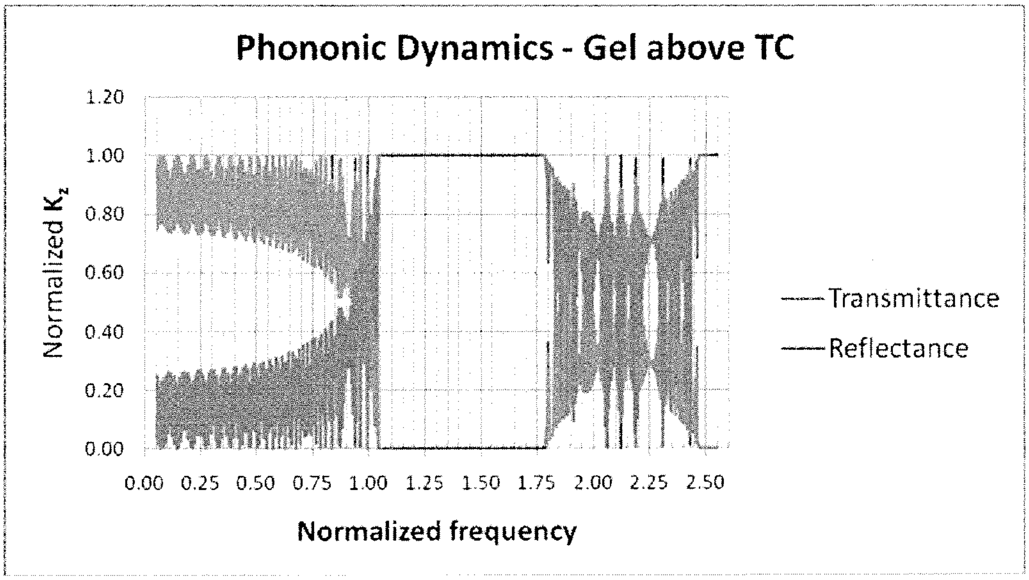
FIG. 8 shows the transmittance and reflectance characteristics of an example structure with the gel above critical temperature.

The phase change in the gels is electromagnetically modulated and results in the reflective/transmittive property changes. These changes are shown in FIG. 7, below the critical temperature, and in FIG. 8, above the critical temperature. As can be seen clearly from FIGS. 7 and 8, the bandgap characteristics change drastically between the two states. The bandgap, the area where the transmittance is 0% and the reflectance is 100%, shifts by roughly 20% for the central gap, and 40% for the higher frequency gap based on the central frequency. The width of each gap also changes about 10%. Many of the applications are discussed in other sections of this disclosure; however, each application is essentially an exercise in controlling the bandgap characteristics of the crystal.

When dealing with a periodic structure the unit cell is the fundamental volume/area of periodicity, and the filling fraction is defined as the fraction of the unit cell that is occupied by a scatterer. The acoustic dynamics of a PnC are affected by the size, shape, and arrangement of the scatterers, the density, longitudinal, and transverse sound velocities of the materials used in the structure, and the wavevector of the particular phonon. The acoustic dynamics can be determined by essentially three parameter groups: filling fraction, interaction, and material. The filling fraction parameter is dependent on the size, shape, and periodic arrangement of the scatterers. The interaction parameter is dependent on the shape and orientation arrangement of the scatterers, as well as the wavevector of the impinging acoustic wave. The material parameters include material densities, longitudinal and transverse sound velocities, the contrast in densities between the scatterers and background, and the environment in which the device is meant to work (water, air, metal, etc.). The less the density contrast, the less the structure will have properties derived from its periodicity. So, in the material parameter, a significant density contrast is required for an effective device.

The filling fraction, interaction, and material parameters will determine the acoustic dynamics of a particular phonon classified by its wavelength. The effect on a particular wavelength can, ideally, be scaled by maintaining the filling fraction, interaction, material parameters, and ratio $f \cdot a_0$=Constant, where f=frequency, $a_0$=lattice constant of phononic crystal from which acoustic behavior is based, and the Constant is determined from some base design. This is an invaluable piece of information as it, in essence, means that a single design can be used to accomplish a multitude of tasks. An EMTAD filter designed to work for ultrasonic frequencies could just as easily be scaled to work in sonic or sub-sonic frequencies with only scaling.

The primary potential application areas for phononic crystals and acoustic materials having the characteristics described herein are as waveguides, acoustic filters, dampeners, and lenses. The tunability factor included in the current acoustical material would be very valuable to each field.

In waveguide applications, the acoustic material could be used in phononic cloaks. Phononic cloaks have been proposed (Cummer and Schurig 2007), modeled (Torrent and Sanchez-Dehesa 2008). With the acoustic material described herein, a tunable cloak could be made that would be able to change which frequencies are cloaked quickly and efficiently. This is particularly intriguing for military sonar applications. Utilization of electromagnetically tunable phononic crystals into the designs of the phononic cloaks allows the cloaking technology to be flexible through non-contact means. Currently, cloaking technology is highly dependent on topological design features that restrict the technology to cloaking areas of space and not tailored shapes. Tunable phononic crystals could be critical to solving the problem for cloaking tailored shapes.

Tunable filters have also been proposed (Wu et al. 2009). Tunable phononic filters would be primarily applicable in detector or sensor technology, but could also have applications in noise filtering technologies. A sensor or detector could be used in systems that are sensitive to certain vibrational modes. If the vibrational mode is damaging to the system, the tunable phononic crystal could be used to isolate the system from the vibrational modes in question while still allowing other vibrational modes. Though the design of the phononic crystal would have to be customized depending on the goal of the sensor, detector, or noise filtering technology, the underlying concept in the design of the phononic crystal would remain intact. An electromagnetically tunable material would be incorporated into the design of the phononic crystal so that the bandgap could be tuned without contact by an electromagnetic source.

As a tunable filter, the acoustic material could be used to selectively filter out noise from venues such as concerts or sporting events that may create excessive noise to the local inhabitants. An example may be a sports stadium which is in a populated area. The tunable acoustic material could be used to block sound when it is deemed that an event will be disruptive to the local area, and allow sound otherwise. The present invention could also be used to selectively filter mechanical vibrations for instruments that are highly sensitive to certain phononic vibrations. By using electromagnetic radiation, the density contrast of the phononic crystal can be changed such that the propagation of a particular subset of acoustic wavelengths can be detectably and predictably altered. This would produce a tunable phononic crystal that is a hypersonic acoustic filter.

The tunable acoustic material would also be useful in a phononic lens. Tunable phononic lenses allow for the focusing/defocusing of sound and can be designed to "bend" sound by using a gradient density structure. In addition, the region of cloaked frequencies can be changed without physically changing the rigid portions of the structure. A tunable phononic crystal lens could be used to get a high resolution sonic bio-image of organic matter. By actively focusing/defocusing ultrasonic waves, the density contrast resolving power can be greatly improved for any given ultrasonic device in situ. This would be useful in that it could provide an essentially harmless highly dependable method to detect possibly dangerous small-scale biological defects that would otherwise require X-ray equipment or more expensive magnetic resonance imaging.

The design parameters of the tunable acoustic material are flexible. The phononic bandgap is dependent on the lattice periodicity, the size and shape of the contrasting scatterers, and elastic contrast. Each of these components can be designed for a particular bandwidth. The change in elastic contrast or any other parameter will vary based on the materials used. However, as long as the acousto-elastical properties of the material are modified by the application of a electromagnetic field, the underlying concept is preserved.

EXAMPLE 1

EM-Tunable Pass-Band Filter

The pass-band filter utilizes the phononic stop-band of a PnC to filter out select frequencies. At the most basic level, it is a uniform, periodic arrangement of scatterers in a background medium. Tuning can be accomplished by changing any of the acoustic dynamic parameters using an EM stimulus. For this example, a basic periodic arrange of steel scatterers is arranged in a background of PNIPAm hydrogel. Using a UV or infrared source to induce a change in the state modifies the material parameter of the system by changing the density contrast of the structure.

Figure 9:
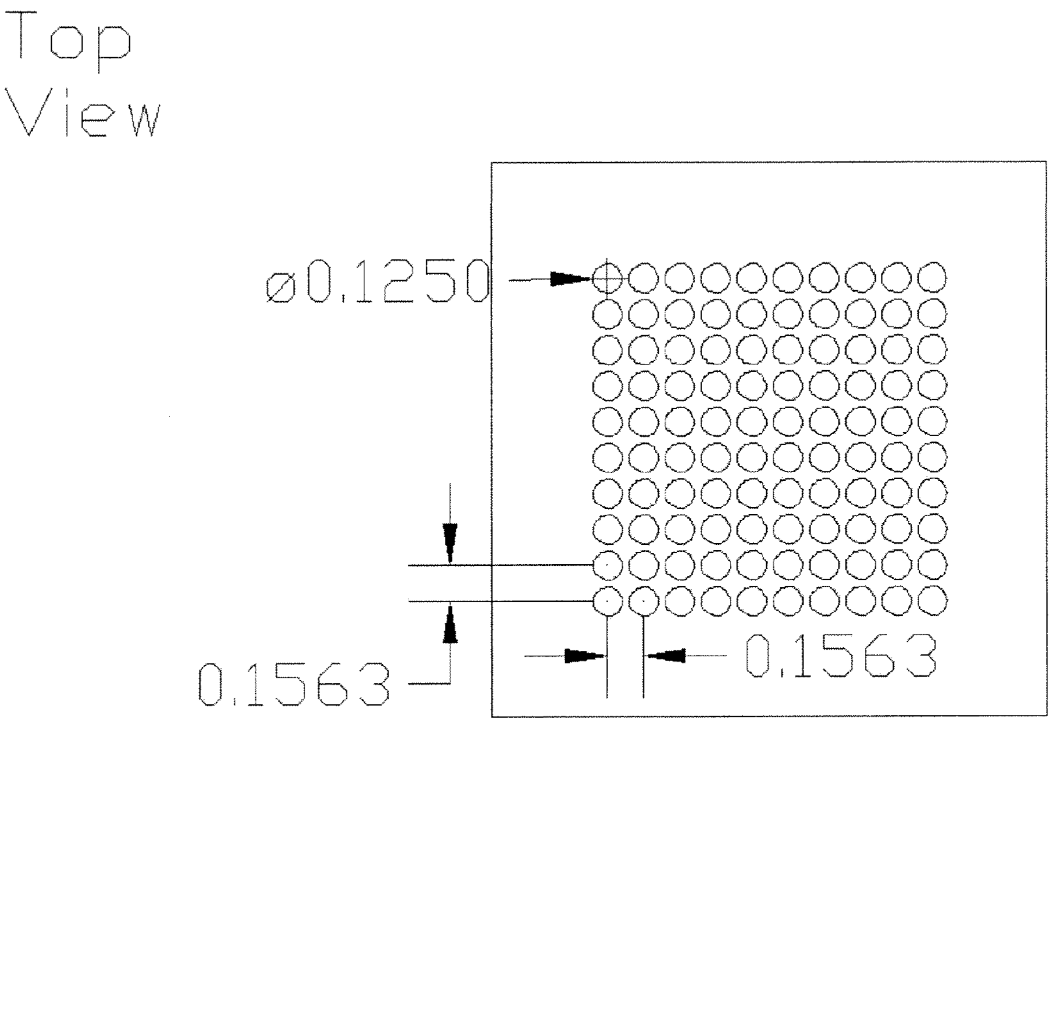
FIG. 9 shows the basic design for an example of a tunable acoustic filter.

The basic design for the example structure is shown in FIG. 9. Cylindrical stainless steel rods are arranged in a square lattice with the spaces interstitially filled with poly-n-isopropylacrylamide ("PNIPAm") hydrogel. The length and diameter of the rods are 8" and 0.125", respectively. The lattice spacing is 0.1563", giving a filling fraction of 50.2%. The rods are stabilized by inserting 0.5" of the rods into a 0.5" base plate composed of plexiglass or similar compound. Tuning is accomplished by using either a UV or infrared lamp with >30 W and >90 W power output for a light source distance roughly equal to 18". The light causes the PNIPAm to undergo a discontinuous volumetric phase transition that changes the density of gel. The change in the density of the gel changes the density contrast of the PnC structure, and thus, the propagation characteristics. The device is designed to work in a water or similar liquid environment at frequencies of 220-240 kHz.

There are nearly an unlimited number of ways to modify the base of this structure while still maintaining the property of an EM tunable pass band filter. The keys to maintaining the EM tunable property is to implement materials with physical characteristics that are responsive to some form of EM energy into the structure. In the specific example given here, the physical characteristics of the steel are relatively constant regardless of impinging light. However, PNIPAm hydrogel exhibits a discontinuous volumetric phase transition that is highly responsive to ultraviolet and infrared light. Using a material like PNIPA m in any arrangement of a PnC essentially creates an EM tunable pass-band filter. Ideally, scaling of a structure can be accomplished by maintaining the ratio f·a0=Constant, where f=frequency, and a0=lattice constant of phononic crystal from which acoustic behavior is based. For example, the structure above is designed for 220-240 kHz. To scale the device to begin to work at 22 kHz, a 10× frequency decrease, the structure would need to be scaled up 10× to keep f·a0 constant. The range of operation would also change to 22-24 kHz.

EXAMPLE 2

E-M Tunable Phonotic Bandpass Filter

A phononic bandpass filter is a phononic crystal that will allow the propagation of a select range of frequencies, while denying or significantly inhibiting the propagation of others. The range of frequencies that are restricted from propagation will be called the stopband. This example demonstrates a bandpass filter with a stopband that is manipulated through electromagnetic stimulation. Specifically, this embodiment of the tunable bandpass filter will be tuned using infrared light, and the ambient medium or atmosphere of the device will be water.

The device consists of periodically arranged steel cylinders with an electromagnetically responsive material interstitially filling the spacing between the cylinders. Poly-N-Isopropylacrylamide (PNIPAm) polymer gel formed using the free-radical polymerization technique is a thermal/ electromagnetically responsive polymer gel. PNIPAm, also called a bulk hydrogel when formed using the free-radical polymerization process, undergoes a discontinuous volumetric phase transition when it is exposed to certain energy bands of light for sufficient time, or when it is heated/cooled above/below a lower critical solution temperature. The volumetric change results in a change of its mechanical parameters that then affect the overall propagation characteristics of the device.

Tuning of the device may be accomplished using four unfocused infrared light sources. Based on the dynamics of the material, tuning may also be accomplished using other unfocused frequency ranges (ultraviolet, radio), but is not demonstrated here. The entire apparatus is immersed in a large enough body of water such that the volume of the device is less that 2% of the total volume.

The device is a 10×10 square lattice of 6" long ⅛" diameter standard stainless steel cylinders spaced 5/32" apart. PNIPAm bulk gel, made using the free-radical polymerization technique, fills the spacing between the cylinders, and the device is completely immersed in water. FIG. 10*a* shows a top-down view of the device without hydrogel. FIG. 10*b* shows a side view of the device without hydrogel.

Figure 11:
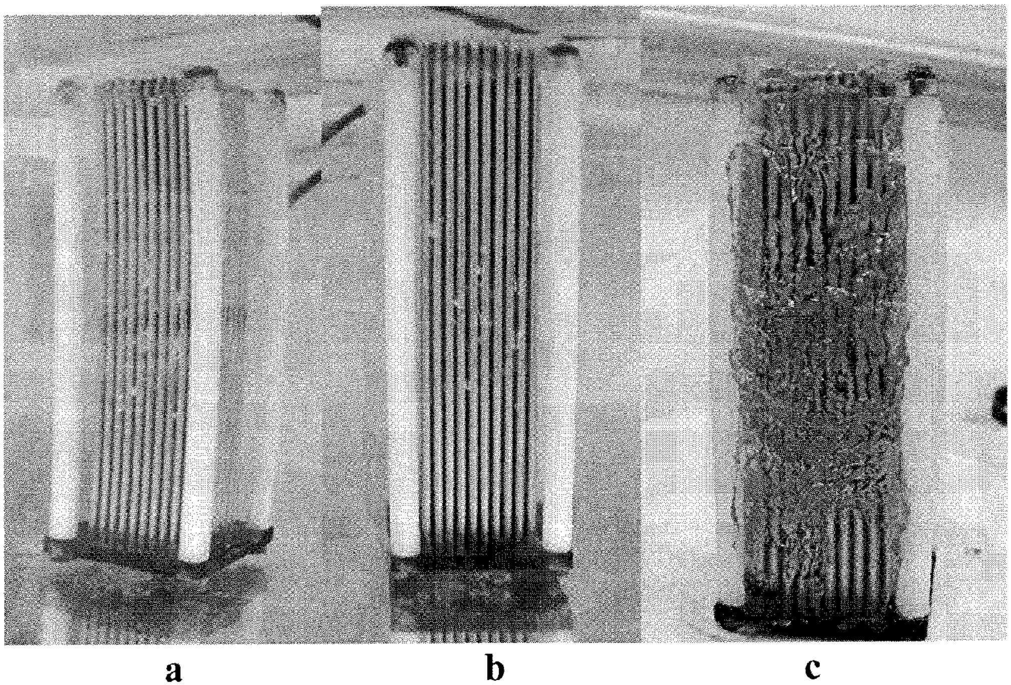
FIG. 11 shows: a) side-view of the device with LCST gel in water; b) side-view of the device with LCST gel in water; and c) side-view of the device with LCST out of water.

FIG. 11 shows: a) side-view of the device with LCST gel in water; b) side-view of the device with LCST gel in water; and c) side-view of the device with LCST out of water.

Figure 12:
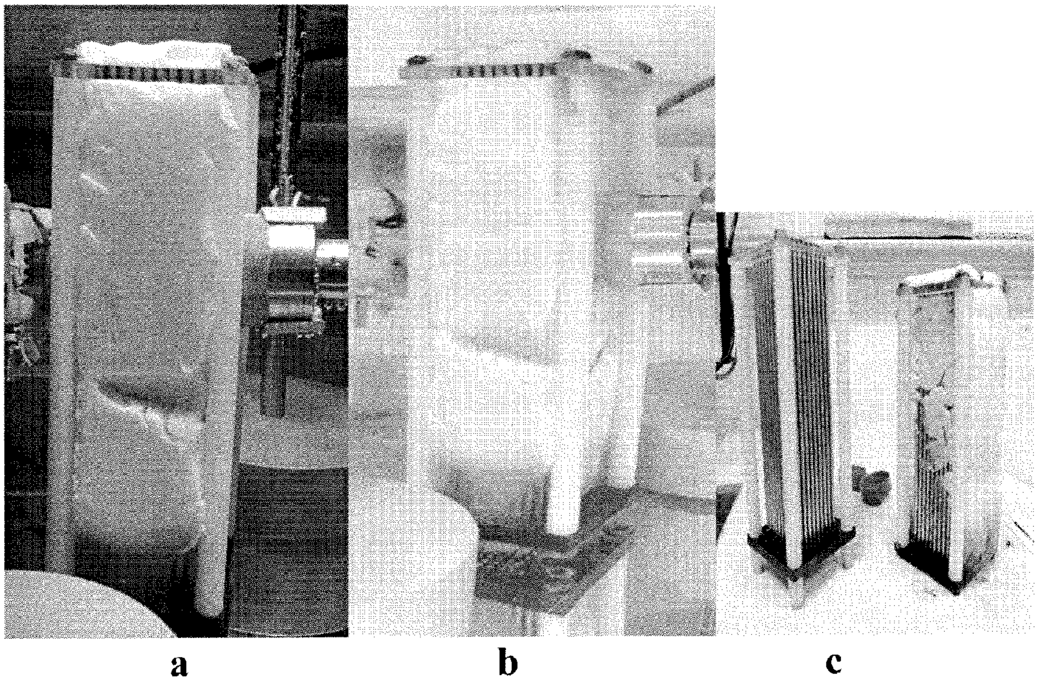
FIG. 12 shows: a) side-view of the device with ACST gel in water, also showing infrared radiation exposure; b) side-view of the device with ACST gel in water; and c) side-view of the device with ACST out of water, compared with a device without the gel.

FIG. 12 shows: a) side-view of the device with ACST gel in water, also showing infrared radiation exposure: b) side-view of the device with ACST gel in water; and c) side-view of the device with ACST out of water, compared with a device without the gel.

The device was operated using two Panametrics V301 0.5 MHz 1" Immersion transducers placed at opposite ends of the device. One transducer was used as a sound source, while the other was used as the receiver. The source frequency was swept from 350-750 kHz and the transmitted sound was measured both with and without electromagnetic stimulation. "LCST" refers to the gel in the lower-critical solution state, whereas "ACST 37.6" refers to the gel above the lower-critical solution state. LCST is also referred to the as the hydrophilic state; ACST 37.6 refers to the hydrophobic state.

Figure 13:
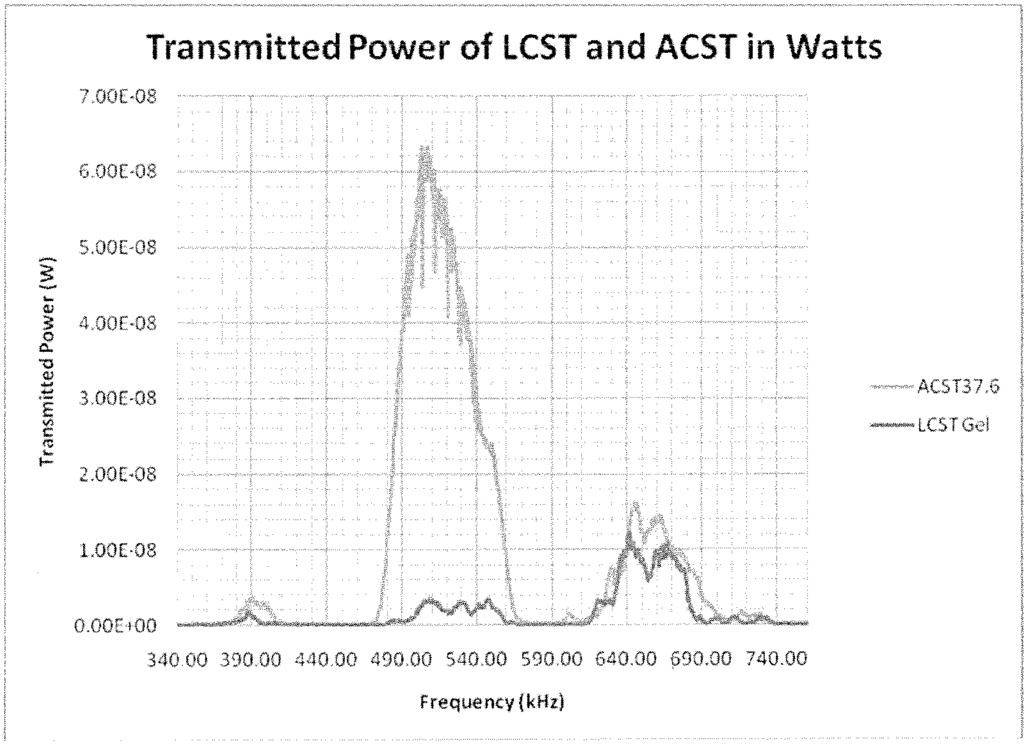
FIG. 13 shows a comparison of transmitted power of the device without infrared exposure (LCST), and with infrared electromagnetic exposure (ACST).
Figure 14:
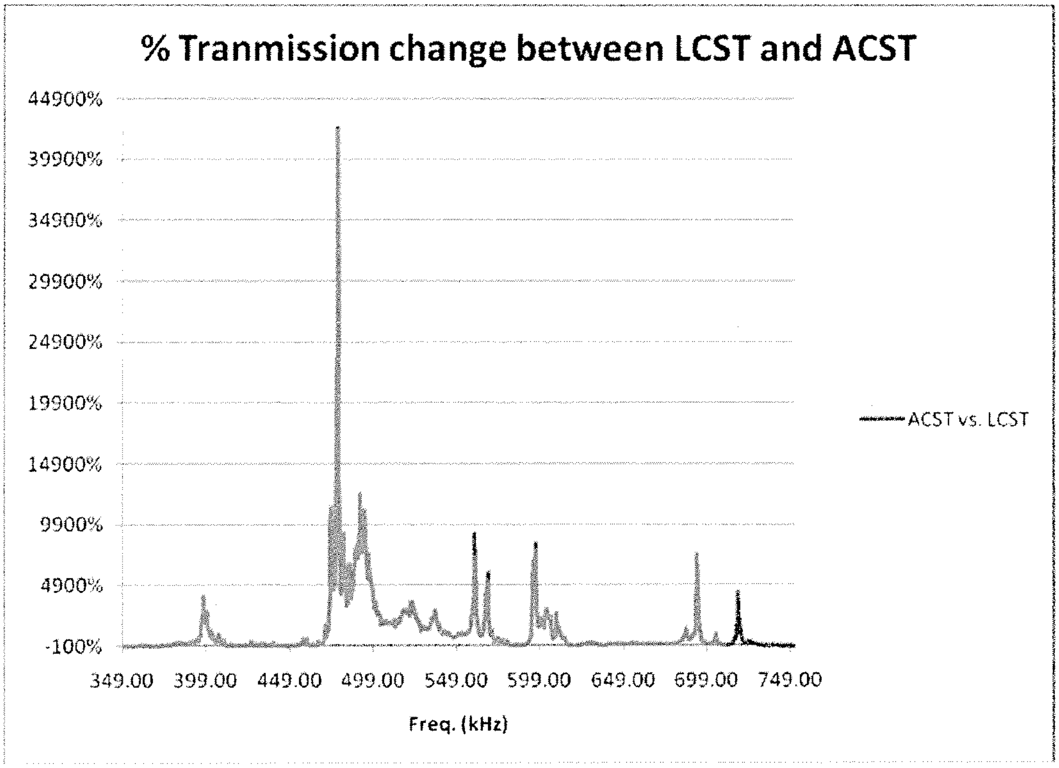
FIG. 14 shows the percent change in transmission in the device in the LCST and ACST state. The ACST state is achieved with infrared electromagnetic radiation exposure.
Figure 15:
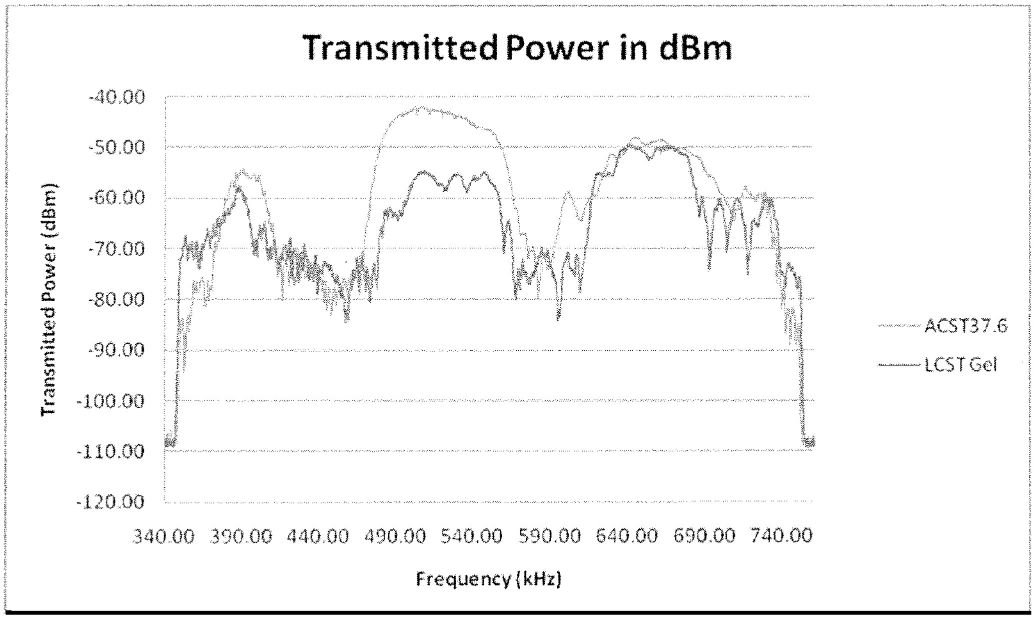
FIG. 15 shows transmitted power in dBm. ACST state is after infrared exposure.

The change in the transmission characteristics with/without infrared exposure is shown in FIG. 13, FIG. 14, and FIG. 15. As can be seen from the figures, there is a very large change in the transmission characteristics as the device is exposed to the infrared electromagnetic radiation. Between ~470-570 kHz, there is a clear stopband that is apparent in the LCST state, but disappears in ACST state after infrared exposure as indicated in FIG. 13. FIG. 14 illustrates changes of over 1000% in the transmission characteristics in the same range. Effectively, in the LCST state, there is a stop band where no sound is allowed through the structure. In the ACST state after infrared exposure, the stopband disappears. This shows clear electromagnetic modulation of the bandstructure characteristics; more specifically, and electromagnetically tunable acoustic device. FIG. 15 shows transmitted power in dBm. ACST state is after infrared exposure.

This example of an electromagnetically tunable phononic bandpass filter demonstrates a working, in-situ tunable acoustic device that is modulated using unfocused infrared light sources. The stainless steel lattice structure provides the base for the propagation properties through the phononic crystal device, while the interstitially filled PNIPAm polymer gel provides an EM responsive component to the structure. As the infrared radiation modulates the state of the polymer between a hydrophilic and hydrophobic state, the mechanical dynamics of the structure, especially with respect to the contrast in densities between the steel scatterer rods and the space between the rods, is modified and sound propagating through the structure is significantly affected. Transmitted ultrasound experiences over a 1000% change between the hydrophilic and hydrophobic states on the absolute power scale in Watts in the 450-550 kHz frequency range.

REFERENCES CITED

The following documents and publications are hereby incorporated by reference.

OTHER PUBLICATIONS

Cummer, S., D. Schurig, "One path to acoustic cloaking," *New Journal of Physics* 9 (2007).

Garner, B., T. Cai, S. Ghosh, Z. Hu, and A. Neogi, "Refractive index change due to volume-phase transition in polyacrylamide gel nanospheres for optoelectronics and bio-photonics," *App. Phys. Exp.* 2 (2009).

Goffaux, C., J. Vigneron, "Theoretical study of a tunable phononic band gap system," *Physical Rev. B* 64 (2001).

Hirotsu, S., I. Yamamoto, A. Matsuo, T. Okajima, H. Furukawa, T. Yamamoto, "Brillouin scattering study of the volume phase transition in poly-N-Isopropylacrylamide gels," *Journal of the Physical Society of Japan* 64 (1995).

Khelif, A., P. Deymier, B. Djafari-Rouhani, J. Vasseur, L. Dobrzynski, "Two-dimensional phononic crystal with tunable narrow pass band: Application to a waveguide with selective frequency," *J. of App. Phys.* 94 (2003).

Kushwaha, M., P. Halevi, L. Borzynski, B. Djafari-Rouhani, "Acoustic Band Structure of Periodic Elastic Composites," *Physical Rev. Letters* 71 (1993).

Robillard, J., O. Bou Matar, J. Vasseur, P. Deymier, M. Stippinger, A. Hladky-Hennion, Y. Pennec, B. Djafari-Rouhani, "Tunable magnetoelestic phononic crystals," *App. Phys. Letters* 95 (2009).

Tang, H. S. Lee. "Direct experimental verification of the sound-induced tunable resonance on a flexible electrorheological layer," *Journal of App. Phys.* 101 (2007).

Torrent, D., J. Sanchez-Dehesa, "Acoustic cloaking in two dimension: a feasible approach," *New Journal of Physics* 10 (2008).

Wan J., X. Xu, X. Liu, G. Xu, "A tunable acoustic filter made by periodical structured materials," *App. Phys. Letters* 94 (2009).

Wu, L., M. Wu, L. Chien, "The narrow pass band filter of tunable ID phononic crystals with a dielectric elastomer layer," *Smart Materials and Structures* 18 (2009).

What is claimed:

1. An electromagnetically tunable acoustic material comprising:

a periodic structure; and a medium with acousto-elastical properties that can be altered by electromagnetic radiation, wherein the medium has a density, bulk modulus, or shear modulus that can be altered by electromagnetic radiation to cause a change in the acousto-elastical properties of the medium and affect acoustic dynamics of the medium.

2. The acoustic material of claim 1, wherein the periodic structure comprises a lattice structure and scatterers.

3. The acoustic material of claim 1, wherein the periodic structure comprises at least two elastic materials.

4. The acoustic material of claim 1, wherein the medium is a polymer medium.

5. The acoustic material of claim 1, wherein the medium is N-Isopropylacrylamide ("NIPA") or Poly (N-Isopropylacrylamide) ("PNIPA").

6. The acoustic material of claim 1, wherein the medium further comprises one or more ferroelectric materials, dielectric materials, multiferroic materials, or combinations thereof.

7. The acoustic material of claim 1, wherein the electromagnetic radiation causes a volumetric change in the medium.

8. The acoustic material of claim 1, wherein the medium is part of the periodic structure.

9. The acoustic material of claim 1, wherein the acoustic material comprises at least one phononic bandgap.

10. A phononic crystal comprising the acoustic material of claim 1.

11. A phononic cloak comprising the acoustic material of claim 1.

12. A tunable phononic filter comprising the acoustic material of claim 1.

13. A phononic lens comprising the acoustic material of claim 1.

14. A method for electromagnetically tuning an acoustic material to bring about a change in its acoustical properties, comprising:

fabricating an electromagnetically tunable acoustic material comprising a periodic structure and a medium with acousto-elastical properties that can be altered by electromagnetic radiation; and applying electromagnetic radiation to the acoustic material to produce a change in its acoustical properties, wherein the medium has a density, bulk modulus, or shear modulus that is altered by electromagnetic radiation to cause a change in the acoustical properties of the medium and affect acoustic dynamics of the medium.

15. The method of claim 14, wherein the change in acoustical properties is a change in phononic bandgap.

16. The method of claim 14, wherein the periodic structure comprises a lattice structure and scatterers.

17. The method of claim 14, wherein the periodic structure comprises at least two elastic materials.

18. The method of claim 14, wherein the medium is a polymer medium.

19. The method of claim 14, wherein the medium is N-Isopropylacrylamide ("NIPA") or Poly (N-Isopropylacrylamide) ("PNIPA").

20. The method of claim 14, wherein the medium further comprises one or more ferroelectric materials, dielectric materials, multiferroic materials, or combinations thereof.

21. The method of claim 14, wherein the electromagnetic radiation causes a volumetric change in the medium.

22. The method of claim 14, wherein the medium is part of the periodic structure.

23. The method of claim 14, wherein the acoustic material comprises at least one phononic bandgap.

24. The method of claim 14, wherein the acoustic material is a phononic crystal, phononic cloak, phononic filter, or phononic lens.

* * * * *